US006842055B1

(12) United States Patent
Morrison

(10) Patent No.: US 6,842,055 B1
(45) Date of Patent: Jan. 11, 2005

(54) CLOCK ADJUSTMENT

(75) Inventor: Robert D. Morrison, Star, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/639,818

(22) Filed: Aug. 13, 2003

(51) Int. Cl.[7] .............................................. H03L 7/00
(52) U.S. Cl. ................................. 327/141; 327/146
(58) Field of Search ................................. 327/141–142, 327/144–147, 149, 152–156, 158–159, 161, 163; 375/354, 356–358, 362, 364

(56) References Cited

U.S. PATENT DOCUMENTS

| | | |
|---|---|---|
| 5,438,353 A | 8/1995 | Morrison |
| 5,638,410 A | 6/1997 | Kuddes |
| 5,760,816 A | 6/1998 | Morrison |
| 5,877,641 A | 3/1999 | Ziegler et al. |
| 5,949,260 A | 9/1999 | Toda |
| 6,014,048 A | 1/2000 | Talaga, Jr. et al. |
| 6,075,832 A * | 6/2000 | Geannopoulos et al. ..... 375/375 |
| 6,275,519 B1 * | 8/2001 | Hendrickson ................ 375/138 |
| 6,313,621 B1 * | 11/2001 | Zwack ...................... 324/76.52 |
| 6,424,198 B1 * | 7/2002 | Wolford ...................... 327/291 |
| 6,550,045 B1 | 4/2003 | Lu et al. |
| 6,724,779 B1 * | 4/2004 | Alleyne et al. ............. 370/517 |
| 2002/0080825 A1 | 6/2002 | Wolf et al. |

* cited by examiner

Primary Examiner—My-Trang Nu Ton

(57) ABSTRACT

Circuits and methods are provided for clock adjustment. A method for clock adjustment includes receiving feedback clocks from independent ASIC modules. The method includes comparing the feedback clocks to a reference clock to generate phase measurement values. A common delay is removed from the phase measurement values to form normalized correction values. Target phase values and clock select values are selected using the normalized correction values. And, clock signals to independent ASIC modules are adjusted based on the target phase values and clock select values.

32 Claims, 8 Drawing Sheets

CLOCK ADJUSTMENT

Clock signals are used to synchronize the transfer of data in electronic circuits. The movement of data is clocked to ensure that data arrives at its intended location at the intended time. Without accurate clocking, applications and computations may not perform as intended.

Application specific integrated circuits (ASICs) are an example of circuits which use clock signals. ASICs are growing in size and density. Indeed, ASICs are getting so large, e.g. 2 million gates and larger, that generating a clock signal with equivalent timing to all portions of the ASIC is more and more difficult. Process, voltage, and temperature (PVT) variations in time across the ASIC die can cause various delays in the arrival of the clock to individual logic circuits, thus causing signal miscommunication and timing failures for different voltages, temperatures and process variations across the ASIC die.

ASIC modules on an ASIC die use one or more clocks to control signal generation and capture between ASIC modules and within individual ASIC modules. Multiple modules that use the same clock assume that the clock arrives to every flipflop with the same clock delay. If signals generated by the ASIC do not have the correct delay, the signals will not arrive in time to their destination module, nor will the module correctly sense inputs from other modules. In some ASICs, the job of accurately providing the clock signal to different ASIC modules is broken down into a tree of clock buffers. Nonetheless, different paths to different modules across the ASIC die can still cause delay variation to the eventual clock signal destination. This issue can be compounded by temperature and process variation across ASICs over time.

DETAILED DESCRIPTION

As noted above, clock circuits are used to move data to intended locations at intended times in order to perform electronic applications and computations. For purposes of illustration, the description which follows will be discussed in reference to an application specific integrated circuit (ASIC) clock circuit. However, as one of ordinary skill in the art will appreciate upon reading this disclosure, embodiments of the invention are not limited to use in connection with an ASIC clock circuit on an ASIC die.

In ASICs and other integrated circuits (ICs), generating a clock signal with equivalent timing to all portions of an ASIC is becoming more and more difficult. For example, as ASICs grow in size the ASIC clock may be used to drive tens or hundreds of thousands of flipflops within various logic circuits. The timing to these circuits should be synchronized.

In some ASICs, a single system clock is generated in a system clock module, and then this clock is routed to all of the modules within the ASIC. When a clock signal is routed to multiple modules through the circuit there can be a variable clock delay for each ASIC module, or block, that the clock is trying to drive. Once received within each ASIC module, the clock signal is buffered and then drives the clock input of all the ASIC module's logic circuits. Routing delays and clock loading can cause the system clock signal to arrive at different modules at different times.

Embodiments include a synchronizing phase adjust state machine circuit, a synchronizing phase select circuit, and a phase measure circuit associated with each ASIC module of an ASIC die. A compute normalized delay block normalizes out a common delay for all ASIC modules. The synchronizing phase adjust state machine circuit outputs a target phase tap and a clock select tap. The synchronizing phase select circuit provides the target phase to a register which provides the target phase to a clock multiplexer for adjusting clock delay to a given ASIC module. The synchronizing phase select circuit is operable on the clock select tap to safely signal when the register should introduce the target phase to the clock multiplexer.

Figure 1:
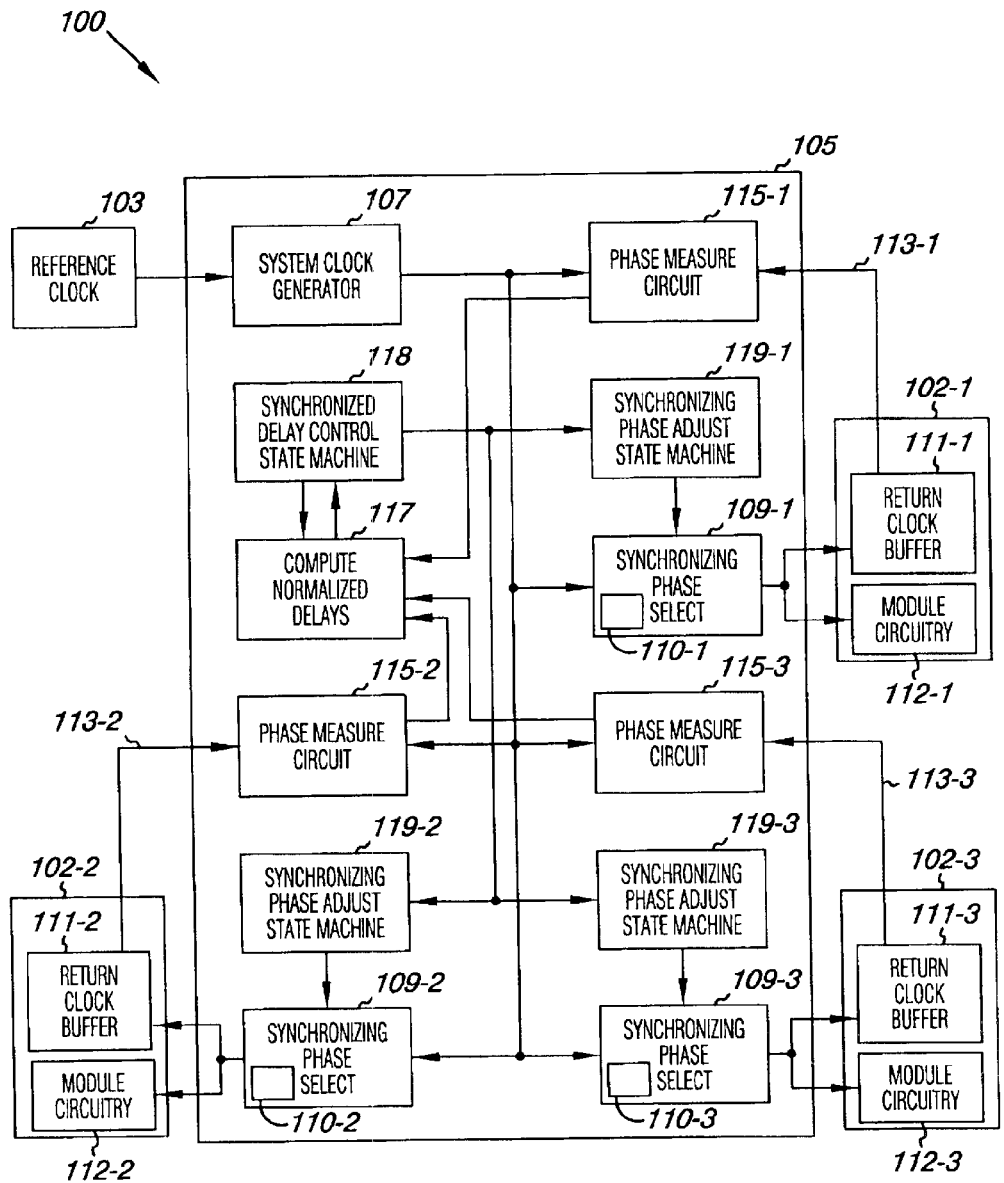
FIG. 1 illustrates a block diagram for an embodiment of a clock circuit.

FIG. 1 illustrates a block diagram for an embodiment of an integrated circuit (IC) 100 as can be associated with an ASIC die. As shown in the embodiment of FIG. 1, the IC 100 includes a number of modules such as ASIC modules 102-1, 102-2, and 102-3 which can be associated with the ASIC die. Any number of modules can be included. Embodiments of the invention are not so limited. In the embodiment of FIG. 1 a system or reference clock 103 is coupled to a clock circuit 105. The clock circuit 105 can be used as an ASIC clock circuit and will be referred to as such herein for purposes of illustration. However, as noted above, embodiments of the invention are not limited to use in connection with an ASIC clock circuit on an ASIC die.

As shown in the embodiment of FIG. 1, the ASIC clock circuit 105 is coupled to each of the individual ASIC modules, 102-1, 102-2, and 102-3, of the ASIC die. The system (reference) clock 103 provides a clock signal to a system clock generator 107 on the ASIC clock circuit 105. The system clock generator 107 generates incrementally delayed clocks which are provided to a number of synchronizing phase select circuits, shown as modules 109-1, 109-2, and 109-3. By way of example, and not by way of limitation, the system clock generator 107 may generate 32 possible clock signals. As shown in the embodiment of FIG. 1, a synchronizing phase select circuit, 109-1, 109-2, and 109-3, is associated with and coupled to each ASIC module, 102-1, 102-2, and 102-3, of the ASIC die. The synchronizing phase select circuits, 109-1, 109-2, and 109-3, each include a clock multiplexer, 110-1, 110-2, and 110-3. The synchronizing phase select circuits, 109-1, 109-2, and 109-3, are described in more detail below in connection with FIG. 4.

Each synchronizing phase select circuit, 109-1, 109-2, and 109-3, can provide an adjusted clock signal to its associated ASIC module, 102-1, 102-2, and 102-3, during ASIC use, without missing clocks or introducing runt pulses, in order to provide synchronous timing to all portions of the ASIC die.

As shown in the embodiment of FIG. 1, the clock signal from the system clock generator 107 is also provided as a reference clock signal to a number of phase measure circuits 115-1, 115-2 and 115-3. As stated, each phase measure circuit, 115-1, 115-2 and 115-3, is associated with and coupled to a respective ASIC module, 102-1, 102-2, and 102-3, of the ASIC die.

The clock signals routed from each synchronizing phase select circuit, 109-1, 109-2, and 109-3, to each respective ASIC module, 102-1, 102-2, and 102-3, drive that particular ASIC module's logic circuits, shown as module circuitry 112-1, 112-2, and 112-3.

These clock signals are also provided to a low impedance return clock buffer, shown as 111-1, 111-2, and 111-3, on each respective module, 102-1, 102-2, and 102-3. The return clock buffers, 111-1, 111-2, and 111-3, route the clock signal received at each ASIC module, 102-1, 102-2, and 102-3, back to a phase measure circuit, 115-1, 115-2 and 115-3 associated with the particular ASIC module via a low impedance path, 113-1, 113-2, and 113-3. The low impedance path can include a low impedance wire or metallization path, such as a wide metallization bus-type path.

The clock signal from each return clock buffer, 111-1, 111-2, and 111-3, is input to each phase measure circuit, 115-1, 115-2 and 115-3. The clock signal corresponds to the clock which was actually received at the particular ASIC module. The clock signal received from the ASIC module is then measured by the phase measure circuit, 115-1, 115-2 and 115-3, against the reference clock signal provided from the system clock generator in order to generate a measured phase delay value for each particular ASIC module, 102-1, 102-2, and 102-3.

As shown in the embodiment of FIG. 1, the measured phase delay value for each particular ASIC module, 102-1, 102-2, and 102-3, is then provided from each phase measure circuit, 115-1, 115-2 and 115-3, to a compute normalized delays block 117. An embodiment of the compute normalized delays block 117, as discussed in more detail in connection with FIG. 2, is operable to receive the measured phase delay value produced by each of the phase measure circuits, e.g. 115-1, 115-2 and 115-3, and is operable to carefully compute a new normalized correction value for each particular ASIC module, 102-1, 102-2, and 102-3.

The compute normalized delays block 117 is illustrated coupled to a synchronized delay control state machine 118. The synchronized delay control state machine 118 regulates the frequency of correction, or phase adjustment, performed by the clock circuit 105. Once the new normalized correction values for each particular ASIC module, 102-1, 102-2, and 102-3, are computed the synchronized delay control state machine 118 begins the phase offset, or shift, e.g. phase travel, for phase adjustment. That is, the new normalized correction values for each particular ASIC module, 102-1, 102-2, and 102-3, are provided to the synchronized delay control state machine 118 and on to a synchronizing phase adjust state machine circuit, shown as 119-1, 119-2, and 119-3. A synchronizing phase adjust state machine circuit, 119-1, 119-2, and 119-3, is associated with each particular ASIC module, 102-1, 102-2, and 102-3. An embodiment of the synchronizing phase adjust state machine circuits, 119-1, 119-2, and 119-3, is described in more detail below in connection with FIG. 3.

As shown in the embodiment of FIG. 1, each synchronizing phase adjust state machine circuit, 119-1, 119-2, and 119-3, is coupled, respectively, to an synchronizing phase select circuit, 109-1, 109-2, and 109-3, for a particular ASIC module, 102-1, 102-2, and 102-3. The synchronizing phase adjust state machine circuits, 119-1, 119-2, and 119-3, and the synchronizing phase select circuits 109-1, 109-2, and 109-3 cooperate to carefully adjust the phase to each respective ASIC module, 102-1, 102-2, and 102-3 through intermediate phase adjust step sizes. Embodiments of the operation of the compute normalized delays block 117, the synchronizing phase adjust state machine circuits, 119-1, 119-2, and 119-3, and the synchronizing phase select circuits 109-1, 109-2, and 109-3 are described further in connection with FIGS. 2–5.

Figure 2:
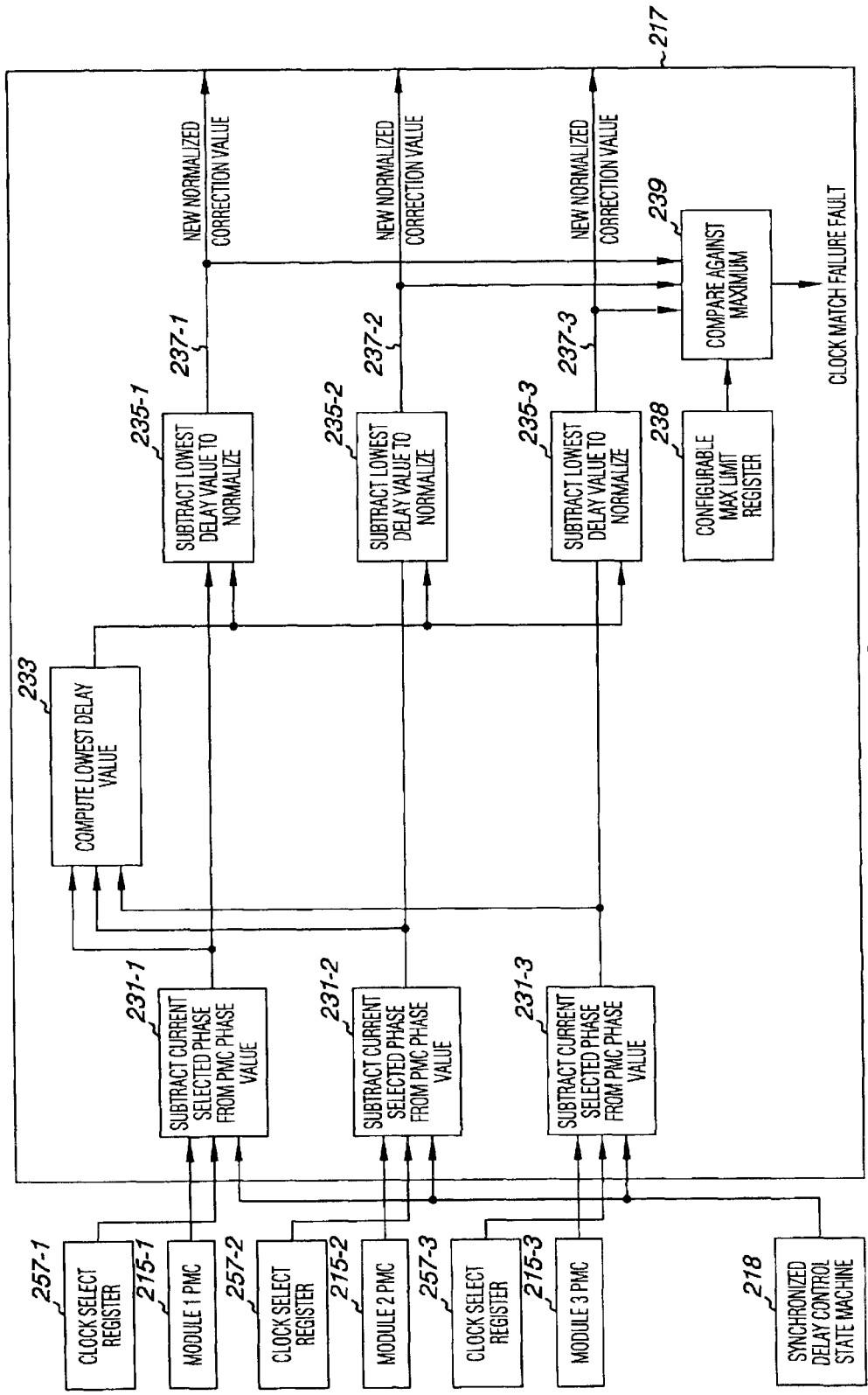
FIG. 2 illustrates a block diagram for an embodiment of a compute normalized delays block as part of the clock circuit shown in FIG. 1.

FIG. 2 illustrates a block diagram for an embodiment of a compute normalized delays block 217 which can serve as compute normalized delays block 117 shown in FIG. 1. As shown in the embodiment of FIG. 2, the compute normalized delay block 217 receives a measured phase delay value for each particular ASIC module as generated from a respective phase measure circuit, 215-1, 215-2 and 215-3. That is, phase measure circuit, 215-1, 215-2 and 215-3 are shown as phase measure circuits 115-1, 115-2 and 115-3 associated with ASIC modules 102-1, 102-2, and 102-3 in FIG. 1.

The measured phase delay value represents the phase of the current clock at the ASIC module, e.g. 102-1, 102-2, and 102-3, relative to the reference clock signal, e.g. the clock signal from the system clock generator 107 described above in connection with FIG. 1. The measured phase measured phase delay value, represented as a binary number, is passed to a respective logic circuit, shown as 231-1, 231-2, and 231-3. As used herein the logic circuits can be comprised gates programmable by software, firmware, or some combination thereof. Each of these logic circuits, 231-1, 231-2, and 231-3, also receives an input from the synchronized delay control state machine 218, shown as 118 in FIG. 1, and receives a feedback input signal, representing a current selected phase as selected by a clock select register 257. An embodiment of the clock select register 257 is described in more detail in connection with FIG. 4. The input from the synchronized delay control state machine 218, shown as 118 in FIG. 1, regulates the frequency of correction, or phase adjustment, performed by the clock circuit.

Each logic circuit, 231-1, 231-2, and 231-3, subtracts the feedback input signal, e.g. the clock select register 257 signal, from a respective phase measure circuit (PMC), 215-1, 215-2 and 215-3 value for a given ASIC module. As stated, the synchronized delay control state machine 218 regulates the frequency of this action. To illustrate, by way of example and not by way of limitation, the synchronized delay control state machine 218 can provide a single bit signal to each logic circuit, 231-1, 231-2, and 231-3, to regulate, or control, the frequency of triggering the subtraction.

The output from each of these logic circuits, 231-1, 231-2, and 231-3, is the correction value for use to offset, or shift, the current clock being provided to a given ASIC module to reach a target phase value. As shown in the embodiment of FIG. 2, the correction values for each respective ASIC module are provided as input signals to a logic circuit 233. Logic circuit 233 will determine the lowest phase delay value, from among these input signals, and then output this lowest phase delay value.

As shown in the embodiment of FIG. 2, the output from logic circuits, 231-1, 231-2, and 231-3, is also provided as an input signal to another set of logic circuits, shown as 235-1, 235-2, and 235-3. The output representing the lowest phase delay value, for the respective ASIC modules is also provided as an input to logic circuits 235-1, 235-2, and 235-3.

Each individual logic circuit, 231-1, 231-2, and 231-3, is paired to provide an input signal to one of logic circuits 235-1, 235-2, and 235-3 respectively per ASIC module. Logics circuits 235-1, 235-2, and 235-3 subtract the lowest delay value, computed by logic circuit 233 and received on one input, from the correction value received on another input from one of the respective logic circuits, 231-1, 231-2, and 231-3. This produces new normalized correction values. If all of the ASIC modules have more than enough delay, then a common delay part is normalized out by the compute normalized delays block 217.

The embodiment of FIG. 2 illustrates clock delay feedback being operated on for three ASIC modules. Thus, in the embodiment of FIG. 2, the new normalized correction values for each of the three ASIC modules, is output from logic circuits 235-1, 235-2, and 235-3 to lines 237-1, 237-2, and 237-3 respectively.

As shown in the embodiment of FIG. 2, the compute normalized delays block 217 can also be provided with a configurable limit register 238 to set a limit to the phase adjust. The purpose of the limit register 238 is that it is possible that correction value will be associated with a range larger than the available delay range of the clock circuit. That is, the compute normalized delays block 217 may discover that the delay adjustment for acceptable performance is outside of the clock circuit's adjustment range.

To address this issue, the output signals from logic circuits 235-1, 235-2, and 235-3 can be input to a compare block 239. The limit phase adjust from register 238 is also provided to compare block 239. The compare block 239 checks to determine if the delay adjustment is outside of the delay range. If this is the case, a fault register (not shown) could be asserted to trigger a system processor fatal interrupt. To compensate, however, the synchronized delay control state machine, e.g. 118 in FIG. 1, can be firmware programmable to adjust the frequency of correction.

In summary, the compute normalized delays block 217 described herein removes a common phase delay part before further extracting a phase difference to apply to reach a target phase. By performing this normalization in the compute normalized delays block 217, the phase offset, or shift, is reduced and it becomes less likely that a clock cycle between ASIC modules will be lost.

Figure 3:
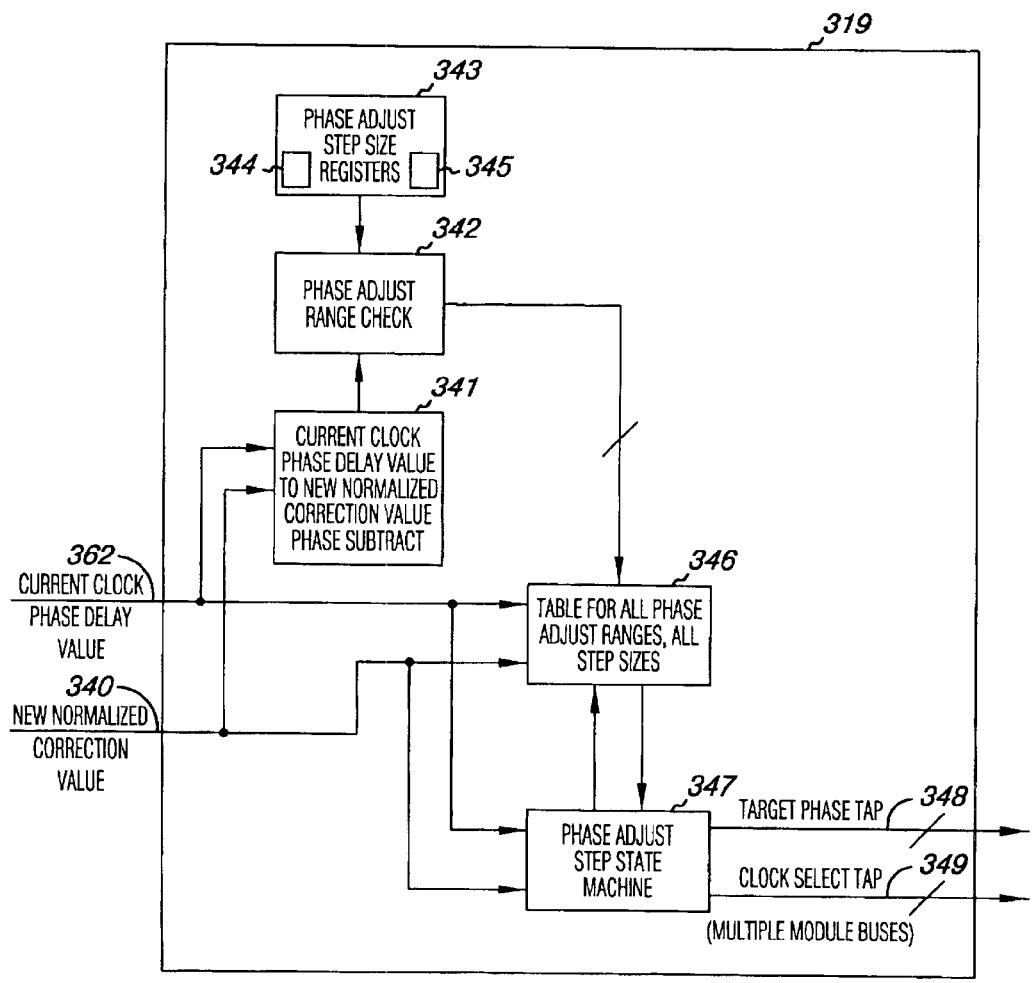
FIG. 3 illustrates a block diagram embodiment of a synchronizing phase adjust state machine circuit as part of the clock circuit shown in FIG. 1.
Figure 4:
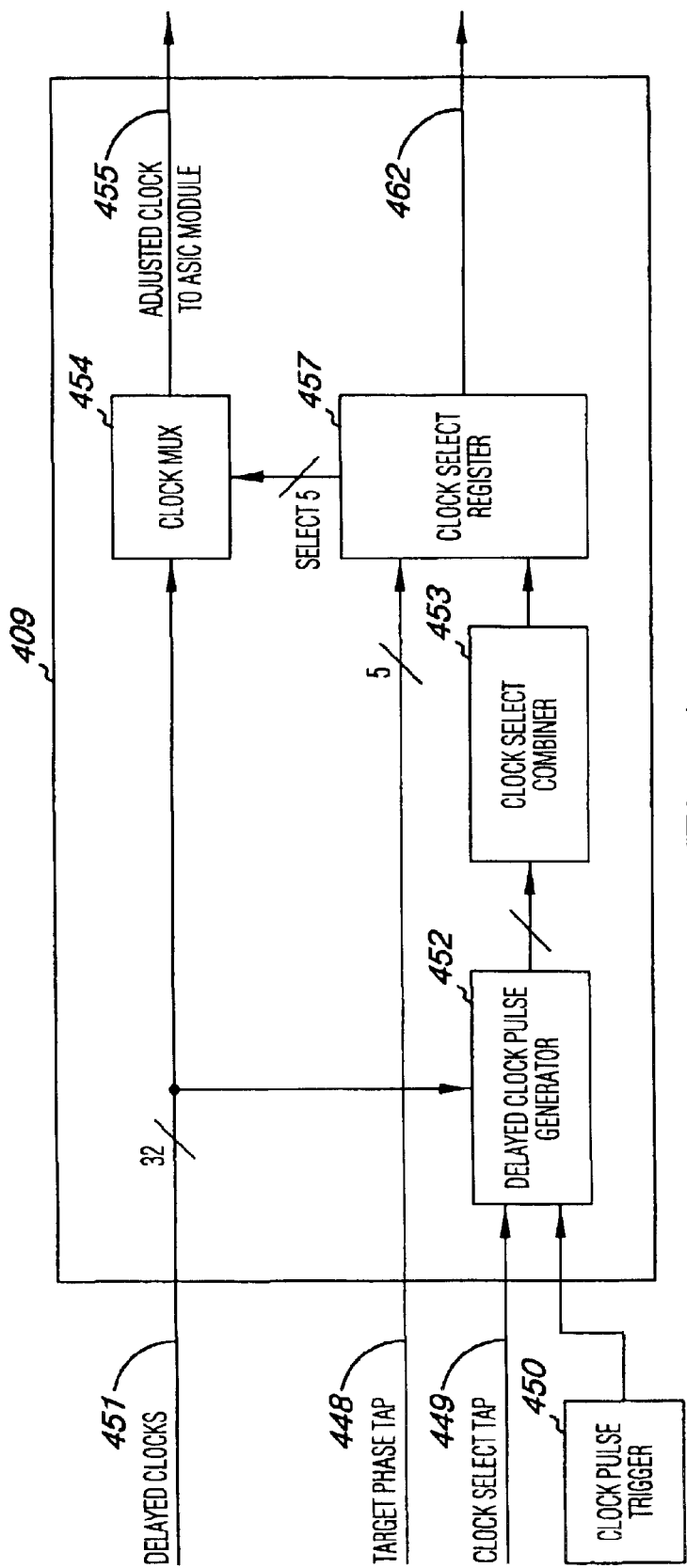
FIG. 4 illustrates a block diagram embodiment of a synchronizing phase select circuit as part of the clock circuit shown in FIG. 1.
Figure 5:
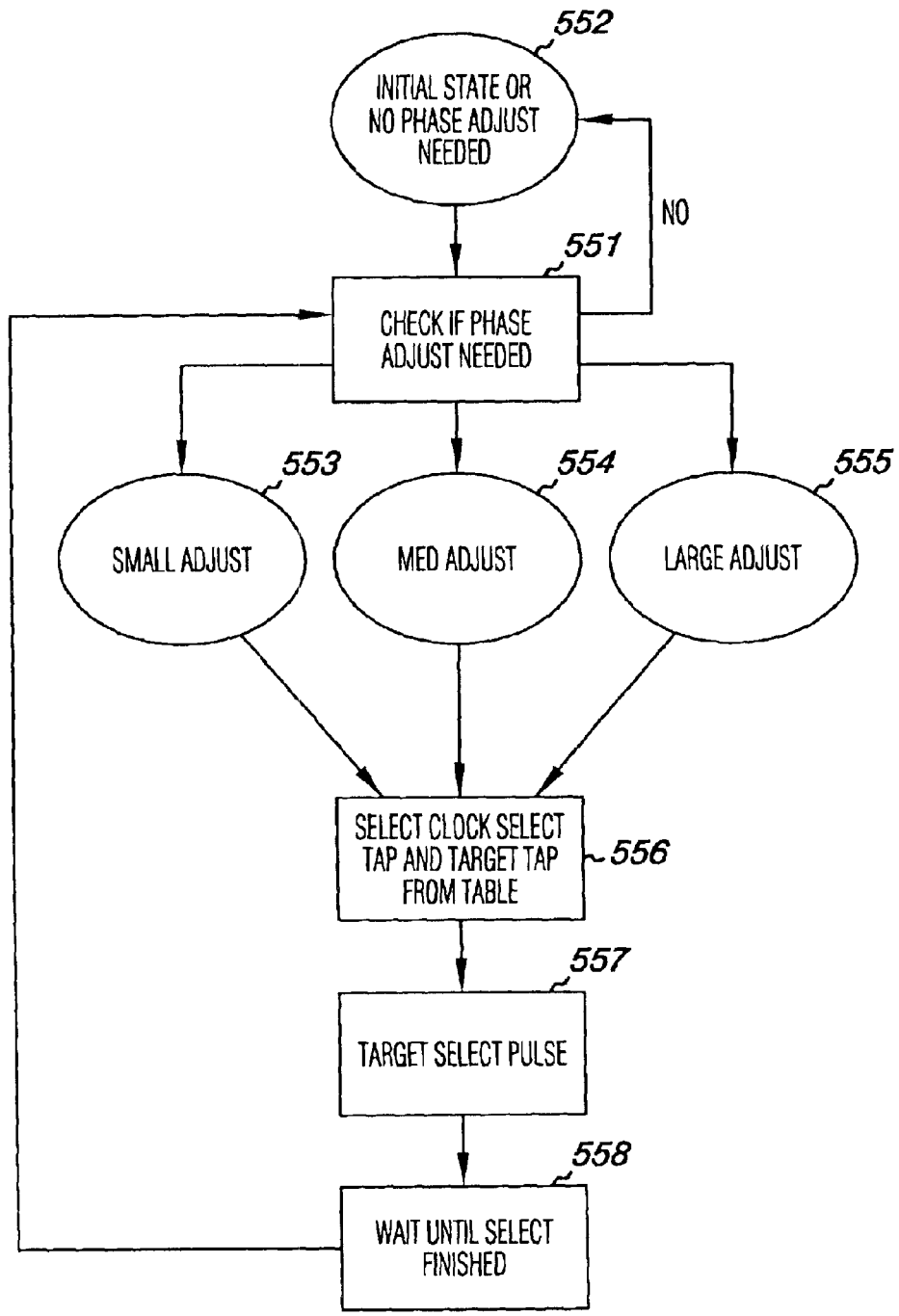
FIG. 5 illustrates a flow diagram embodiment.

For each ASIC module, the ensuing action, described in connection with FIGS. 3–5, is to adjust (positive or negative) using the new normalized correction values, associated with each respective ASIC module.

FIG. 3 illustrates a block diagram embodiment of a synchronizing phase adjust state machine circuit 319. As shown in the embodiment of FIG. 3, the new normalized correction values from logic circuits 235-1, 235-2, and 235-3 in FIG. 2, are respectively input to a synchronizing phase adjust state machine circuit 319. In the embodiment of FIG. 3, a new normalized correction value is input on line 340 to the synchronizing phase adjust state machine circuit 319. As described in connection with FIG. 1, each individual ASIC module will have an associated synchronizing phase adjust state machine circuit 319.

As shown in the embodiment of FIG. 3, a feedback input signal, representing a current clock phase delay value, i.e. current selected phase, as selected by a clock select register (shown as 457 in FIG. 4 and discussed further in connection therewith), is input on line 362 to the synchronizing phase adjust state machine circuit 319.

Each of these inputs lines, 340 and 362, is provided as a binary input to a logic circuit module 341. Logic circuit module 341 subtracts the current clock phase delay value for the respective ASIC module from the new normalized correction value. The result of this operation is provided as a binary number representing a target phase value to a phase adjust range check logic circuit 342. The phase adjust range check logic circuit 342 also receives input from phase adjust step size registers 343.

The phase adjust step size registers 343 can include a range limit register 344 and a step size register 345. The range limit register 344 and the step size register 345 can be set by firmware. In one embodiment, the range limit register 344 includes at least four (4) binary ranges and the step size register 345 includes at least four (4) binary step sizes. For example, the four binary ranges can be divided into four ranges covering binary values above a seven (7), binary values above 3 but less than or equal to 7, binary values above 1 but less than or equal to 3, and binary values less than one. The at least four binary step sizes can include a binary step size of four (4), a binary step size of two (2), a binary step size of one (1), and a binary step size of zero (0).

The binary ranges from the range limit register 344 and the binary step sizes from the step size register 345 can be used by the phase adjust range check logic circuit 342 to select different, intermediate phase step sizes, e.g. small, medium, or large phase steps, in order to continue the phase offset, or shift. As used herein, the continuing phase offset, or phase shifting, is also referred to herein as the "phase travel" for synchronously sweeping the clock signal provided to each ASIC module from one phase delay to another.

Using the example ranges and step sizes given above, the phase adjust range check logic circuit 342 receives the binary number representing a target phase value and compares the binary number to the binary ranges from the range limit register 344. If the binary number representing a target phase value is above 7, a binary step size of four (4) can be chosen. If the binary number representing a target phase value is above 3 but less than or equal to 7 a binary step size of two (2) can be chosen. If the binary number representing a target phase value is above 1 but less than or equal to 3 a binary step size of one (1) can be chosen. And, if the binary number representing a target phase value is less than 1 a binary step size of zero (0) can be chosen. One of ordinary skill in the art will appreciate that many variations on this example configuration can be implemented. The embodiments of the invention are not limited to this example.

Once the phase adjust range check logic circuit 344 has determined the size of phase steps to use, the chosen size of phase steps is output to a table, shown in block 346, for all phase adjust ranges and all phase step sizes. Signals for the size of the phase step can be output to the table 346 on multiple module buses. The table provides a list of associated target phase taps and clock select taps for each binary step size. As one of ordinary skill in the art will appreciate, the number of phase taps can be correlated to a number of different, selected phase step sizes. The table 346 is coupled to a phase adjust state machine 347 and generates a binary output to the phase adjust state machine 347. The phase adjust state machine 347 operates on this binary input as well as input from the new normalized correction value, line 340, and current clock phase delay value, i.e. current selected phase (457 in FIG. 4), line 362, to select what target phase tap value and what clock select tap value to output. The target phase tap value and the clock select tap value are output on lines 348 and 349 respectively. These signals can be output on multiple module buses for each associated ASIC module.

As one of ordinary skill in the art will appreciate from review of the above example, the target phase tap value and clock select tap value can represent intermediate phase step values, e.g. somewhat less, than target phase value that may equate to the phase offset, or shift value goal. This is to ensure that the transition to the target clock phase is made safely such that glitches and missing clocks between ASIC modules are not introduced.

Thus, a table driven state machine is used to specify a target phase and is used to specify a clock select tap used to transition to the target phase tap. The table driven state machine can break up the phase travel in steps as set by the phase adjust step size registers 343. That is, the synchronizing phase adjust state machine circuit 319 outputs a series of intermediate clock phases (along with a corresponding select clock pulse) in such a way that the phase transition is performed safely for each possible current and target clock phase. The size of the intermediate steps before arriving at the target phase determines how quickly the clock circuit can arrive at the target phase, and is a function of the largest phase gap that can be used such that the selected clock tap cannot incorrectly overlap the current clock tap. The synchronizing phase adjust state machine circuit 319 is firmware programmable. Thus, the phase offset, or shift, can accommodate post design adjustment and firmware driven temperature and voltage compensation. FIG. 4, next describes how the phase adjust step state machine 347 drives the adjusted clock generation for a given associated ASIC module.

FIG. 4 illustrates a block diagram embodiment of a synchronizing phase select circuit 409. The synchronizing phase select circuit 409 can serve as the synchronizing phase select circuits shown in FIG. 1, e.g. 109-1, 109-2, and 109-3. As described in connection with FIG. 1, each individual ASIC module will have an associated synchronizing phase select circuit 409.

As shown in the embodiment of FIG. 4, the target phase tap value and the clock select tap value (output on lines 348 and 349 in FIG. 3) are provided on input lines 448 and 449 respectively. The target phase tap value and the clock select tap value vary as determined by, or specified by, the computation performed in connection with the table driven state machine (346 and 347 in FIG. 3). Additionally, each synchronizing phase select circuit 409 receives delayed clock signals on input line 451 as generated from the system clock generator (107 in FIG. 1). In the embodiment illustrated in FIG. 4, input line 451 represents a set of 32 clock signals time shifted with respect to each other.

As shown in the embodiment of FIG. 4, the clock select tap signal is provided on input line 449 to a delayed clock pulse generator 452. The clock select tap value is provided to the delayed clock pulse generator 452 in order to produce a signal which can safely clock a clock select register 457 that selects which clock value is provided to a given ASIC module. It will not suffice to clock this clock selecting register at pre-set, or fixed phase, e.g. phase 0, since performing clock selection at a fixed phase will sometimes cause a runt pulse glitch.

As shown in FIG. 4, the delayed clock signals generated from the system clock generator are provided from input line 451 to this delayed clock pulse generator 452 as well. In this embodiment, the delayed clock pulse generator 452 generates a single pulse that can have 1 of 32 different delays in a range of delays. The selected delay for the pulse is determined by input 449. Thus, by way of example and not by way of limitation, the delayed clock pulse generator 452 can provide 32 possible pulses having incrementally different delays. Embodiments of the invention, however, are not limited to any specific number of incrementally different delays.

The delayed clock pulse generator 452 can be triggered by a trigger source 450. Applying the clock select tap value, as specified by the table driven state machine for all phase adjust ranges (346 in FIG. 3), the delayed clock pulse generator 452 outputs a delayed clock pulse. The output signal (delayed clock pulse) produced by the delayed clock pulse generator 452 is transmitted to a clock select combiner logic circuit 453. The clock select combiner logic circuit 453 operates to provide the pulse output by clock pulse generator 452 on one of its 32 lines with substantially the same propagation delay through clock select combiner logic circuit 453 independent of on which one of the 32 lines the pulse occurs and to prevent the production of a runt pulse.

In one embodiment, the clock select combiner logic circuit 453 is configured with exclusive OR (EXOR) gates. In this manner, regardless of which input is used, a binary tree of equal delays is possible. The clock select combiner logic circuit 453 outputs this carefully selected clocking delay as one pulse in equally spaced intervals to a clock select register 457.

As shown in the embodiment of FIG. 4, the clock select register 457 is coupled to and provides an input to a clock multiplexer 454. The clock multiplexer 454 also receives as another input on line 451 the incrementally delayed clocks from the system clock generator. In the embodiment of FIG. 4, input line 451 represents a set of 32 incrementally delayed clocks.

The target phase tap value is provided as an input on line 448 to the clock select register 457. In this example, the clock select register 457 can be a 5-bit register which will hold a target phase tap value of 0-31 in order to select one of the 32 incrementally delayed clocks. The clock select register 457 provides this value as a clock select signal to the clock multiplexer 454 which then selects which delayed clock will be used. Thus, the clock select register 457 provides a binary input to the clock multiplexer 454 which represents a phase offset, or shift, and this value is used by the multiplexer 454 to select which clock value will be provided to a given ASIC module. As described herein, the clock select register 457 is clocked by the pulse output from clock select combiner logic circuit 453.

The clock select register 457 can hold the target phase tap value, representing a current phase value to transition to the target clock phase until it is updated with a new selected phase. The clock select register 457 can output the value in its register, representing the current selected phase on line 462. The current selected phase is provided as a feedback signal to both the compute normalized delays block (217 in FIG. 2) and to the synchronizing phase adjust state machine circuit (319 in FIG. 3) for use as described above. As one of ordinary skill in the art will appreciate, this process continues until the current phases match the target phases. That is, each phase adjust range check logic circuit (342 in FIG. 3) in each synchronizing phase adjust state machine circuit (319 in FIG. 3) respectively, e.g. as associated with a given ASIC module on an ASIC die, will continue receiving a binary number representing a target phase value and will continue comparing the binary number to the binary ranges from its range limit register (344 in FIG. 3).

The example described in connection with FIG. 3, stated that if the binary number representing a target phase value was above 7, a binary step size of four (4) can be chosen. Here, the chosen binary step size of 4 would be output to the table for all phase adjust ranges and all step sizes (346 in FIG. 3). The look up table, have a list of associated target phase taps and clock select taps for each binary step size, would then provide the appropriate target phase tap value and clock select tap value, intermediate values, to a phase adjust state machine (347 in FIG. 3). The target phase tap value and the clock select tap value would then be provided to a respective synchronizing phase select circuit (409 in FIG. 4) in the manner described above such that a phase transition is made safely for each possible current phase value and target clock phase. The clock select register (457 in FIG. 4) would cycle the current phase value back to the respective synchronizing phase adjust state machine circuit and the process would repeat.

If the binary number representing a target phase value is now above 3 but less than or equal to 7 a binary step size of four (2) would be chosen and the process would repeat. If in the next sequence the binary number representing a target phase value was above 1 but less than or equal to 3 a binary step size of one (1) would be chosen and the process would repeat. Finally, if the binary number representing a target phase value was equal to or less than 1 a binary step size of zero (0) could be chosen.

As noted in the discussion of FIG. 3, many variations on this example configuration can be implemented. The embodiments of the invention are not limited to this example. One of ordinary skill in the art will further appreciate that the target phase may be continually changing. However, according to the embodiments described herein, the clock circuit can correctly chase the new target phase even if the clock circuit hasn't finished stepping to the previous target phase. And, as noted above, the synchronizing phase adjust state machine circuit is firmware programmable. Thus, the phase offset, or shift, can accommodate post design adjustment and firmware driven temperature and voltage compensations.

FIG. 5 illustrates a flow diagram embodiment associated with the clock circuit embodiments described herein. As was described in connection with FIGS. 1–4, a synchronizing phase adjust state machine circuit will check if phase adjust is to be performed in block 551. If no, the process proceeds to block 552 and continues to use the initial state of the delayed clock from the system clock generator. If yes, the process can proceed to select a phase adjust step size. As described herein, different phase adjust step sizes can be provided, e.g. small, medium, or large phase adjust steps as illustrated among blocks 553-554.

As shown in the embodiment of FIG. 5, a selected phase adjust step size value is then used to select a clock select tap and a target phase tap from a table of all phase adjust ranges/all step sizes, illustrated in block 556. In block 557, a target select pulse is generated to adjust the clock to an ASIC module, e.g. as generated by the synchronized phase select circuit described above in connection with FIG. 4.

In block 558, the process can wait an amount of time as controlled or regulated by the frequency of the synchronized delay control state machine (e.g. 118 in FIG. 1) before repeating the process (e.g. before executing the next stepped phase adjust sequence). In some embodiments, the process in block 558 waits until the target select pulse has finished providing an adjusted delay clock to a respective ASIC module. The process then returns, once again, to block 551 to check if phase adjust is to be performed. As noted above, however, the target phase may be continually changing. Accordingly, the sequence can continually chase the new target phase even if it hasn't finished stepping to the previous target phase.

Figure 6:
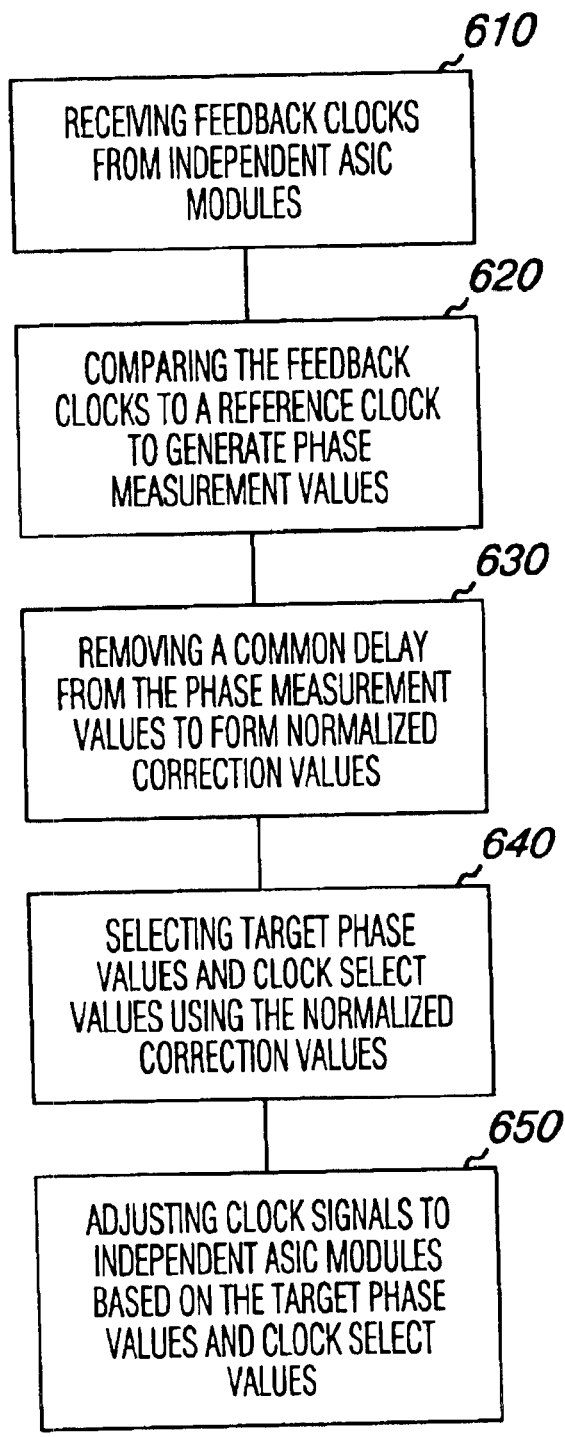
FIG. 6 illustrates a method embodiment.
Figure 7:
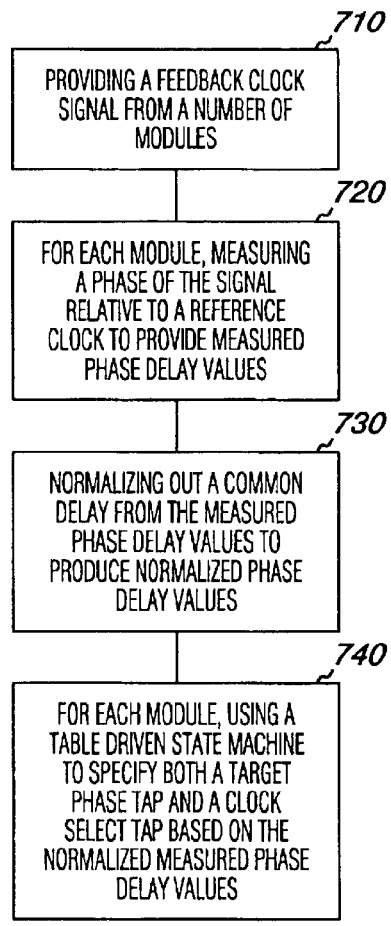
FIG. 7 illustrates another method embodiment.
Figure 8:
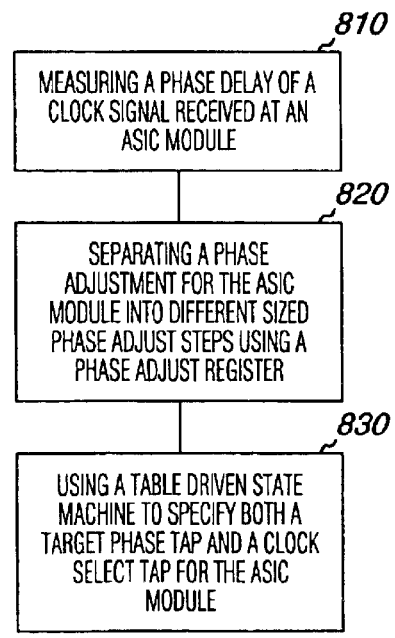
FIG. 8 illustrates another method embodiment.

FIGS. 6–8 are block diagrams illustrating various method embodiments. The various method embodiments provide for handling variable clock delay in a clock circuit while accounting for PVT variations over time. Various method embodiments describe synchronously adjusting clock delay to individual ASIC modules on an ASIC die while the ASIC die is in use.

The various method embodiments can be performed by a set of computer executable instructions operable on a clock circuit, such as the clock circuit described in connection with FIGS. 1–5. Embodiments of the invention are not limited to a particular programming language or operating environment. Unless explicitly stated, the method embodiments described herein are not constrained to a particular order or sequence. Additionally, some of the described method embodiments can occur or be performed at the same point in time.

In the embodiment of FIG. 6, the method includes receiving feedback clocks from independent ASIC modules at block 610. In block 620, the method includes comparing the feedback clocks to a reference clock to generate phase measurement values. In block 630, the method includes removing a common delay from the phase measurement values to produce normalized correction values. Removing a common delay can be performed as discussed above in connection with FIG. 2.

In block 640, the method includes selecting target phase values and clock select values using the normalized correction values. As discussed in connection with FIG. 3, selecting target phase values and clock select values using the normalized correction values includes receiving a new normalized correction value and a feedback signal provided by a clock select register for a particular ASIC module at a logic circuit within a synchronizing phase adjust state machine block. The logic circuit can subtract the new normalized correction value from the feedback input signal and output a binary number representing a target phase value to a phase adjust range check logic circuit. Embodiments further include receiving phase adjust step ranges at the phase adjust range check logic circuit from phase adjust registers. As described in connection with FIG. 3, the phase adjust registers can be firmware programmable phase adjust registers. Embodiments further include comparing the target phase value to the received phase adjust step ranges to select a phase adjust step size. And, embodiments can include comparing a selected phase adjust step size to a table listing associated target phase values and clock select values for various phase adjust step sizes and outputting a binary value to a phase adjust state machine. A target phase value and a clock select value from the phase adjust state machine is output based on the binary value, the new normalized correction value, and the feedback signal. Thus, embodiments include using a table driven state machine to separate phase offset, or shift, (e.g. phase travel from one phase value to another) into different sized steps in connection with a phase adjust register.

In block 650, the method further includes adjusting clock signals to independent ASIC modules based on the target phase values and the clock select values.

In the embodiment of FIG. 7, the method includes providing a feedback clock signal to a phase measurement circuit (PMC) for each of a number of ASIC modules at block 710. In block 720, the method includes, for each module, measuring a phase of the signal relative to a reference clock to provide measured phase delay values. In block 730, the method includes normalizing out a common delay from the measured phase delay values to produce normalized measured phase delay values. And, in block 740 the method includes, for each module, using a table driven state machine to specify both a target phase tap and a clock select tap based on the normalized measured phase delay values.

In the embodiment of FIG. 8, the method includes measuring a phase delay of a clock signal received by an ASIC module at block 810. In block 820, the method includes separating a phase adjustment for the ASIC module into different sized phase adjust steps using a phase adjust register. And, in block 830, the method includes using a table driven state machine to specify both a target phase tap and a clock select tap for the ASIC module. In this manner, embodiments described herein, dynamically compensate for process, voltage and temperature variations over time based on the measured phase delay. In various embodiments, compensating for process, voltage and temperature variations over time includes synchronously sweeping the phase delay of a clock signal from one phase delay to another in a manner so that intermodule communication does not experience phase glitches or missing clocks.

Figure 9:
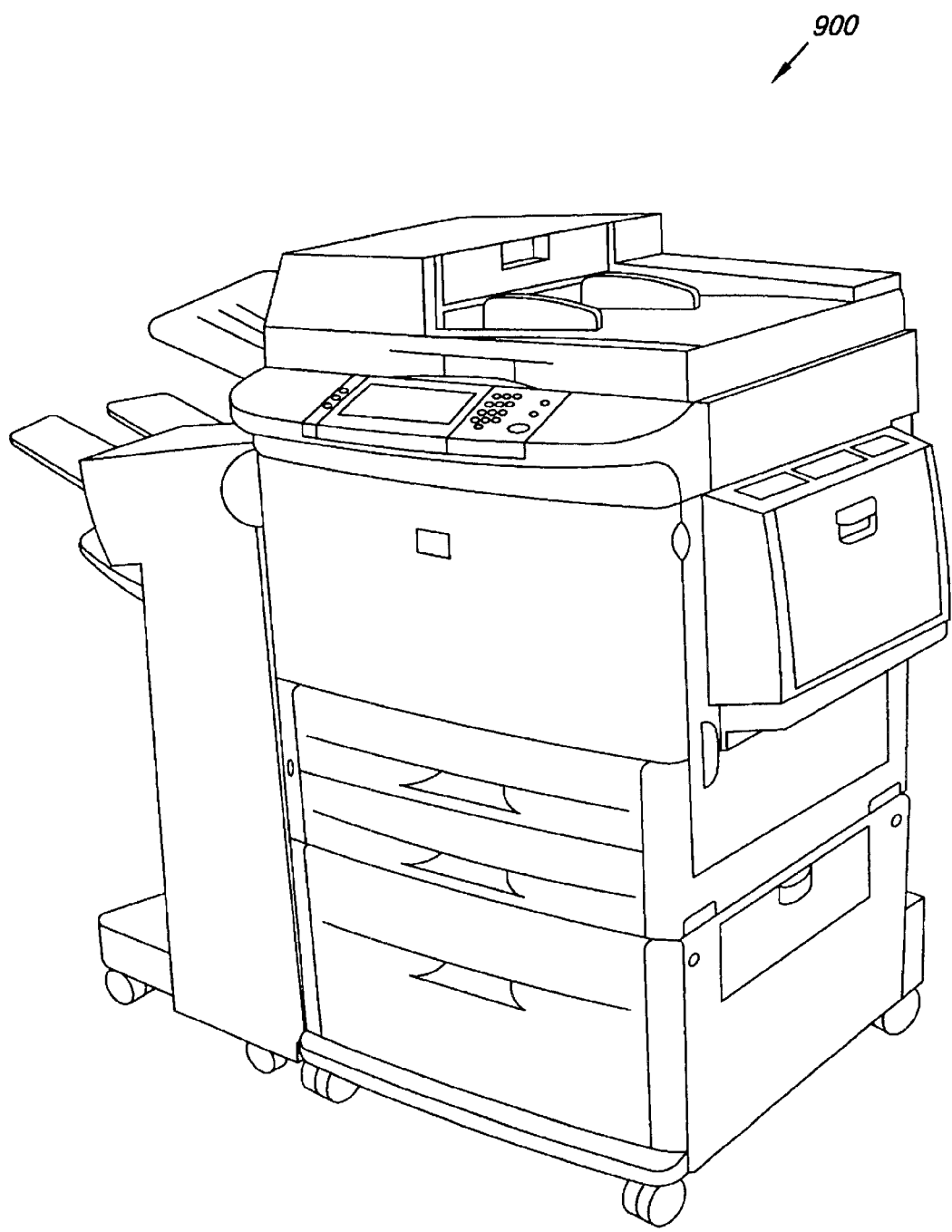
FIG. 9 illustrates an imaging system, such as an electrophotographic printer or inkjet printer, with which embodiments can be implemented.

FIG. 9 illustrates an imaging system, such as an electrophotographic printer or inkjet printer 900, with which embodiments can be implemented. The electrophotographic printer or inkjet printer 900 can be used in a business environment for printing reports, correspondence, desktop publishing, pictures and the like. As one of ordinary skill in the art will appreciate an ASIC clock circuit, according to the embodiments described herein, can be included on a printer formatter board of the electrophotographic printer or inkjet printer 900. However, embodiments of the invention are not so limited.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of the embodiments of the invention. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the invention includes any other applications in which the above structures and methods are used. Therefore, the scope of various embodiments of the invention should be determined with reference to the appended claims, along with the full range of equivalents to which such claims are entitled.

It is emphasized that the Abstract is provided to comply with 37 C.F.R. § 1.72(b) requiring an Abstract that will allow the reader to quickly ascertain the nature of the technical disclosure. It is submitted with the understanding that it will not be used to limit the scope of the claims.

In the foregoing Detailed Description, various features are grouped together in a single embodiment for the purpose of streamlining the disclosure. This method of disclosure is not to be interpreted as reflecting an intention that the embodiments of the invention require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A clock circuit, comprising:
   a clock generator;
   a number of synchronizing phase select circuits coupled to the clock generator to receive a clock signal and coupled to a number of ASIC modules;
   a number of phase measure circuits (PMCs) coupled to the number of ASIC modules, wherein each PMC is also coupled to the clock generator;
   a compute normalized delays block coupled to each of the number of PMCs; and
   a number of synchronizing phase adjust state machine circuits, wherein each of the number of synchronizing phase adjust state machine circuits is coupled to the compute normalized delays block and to one of the synchronizing phase select circuits.

2. The clock circuit of claim 1, wherein each synchronizing phase select circuit includes;
   a delayed clock pulse generator;
   a clock select combiner coupled to the pulse generator, wherein the clock select combiner is coupled to a clock select register; and
   a clock multiplexer coupled to the clock select register.

3. The clock circuit of claim 1, wherein the compute normalized delays block is operable to compare clock delays measured by each PMC and to normalize out a common delay.

4. The clock circuit of claim 1, wherein each synchronizing phase adjust state machine circuit includes a phase adjust range check circuit operable to separate a phase adjustment into different sized steps.

5. The clock circuit of claim 1, wherein each synchronizing phase select circuit includes a table driven state machine used to specify a target phase tap and a clock select tap to transition to a target phase.

6. The clock circuit of claim 5, wherein the target phase tap is provided to a clock select register and wherein the clock select tap is used to provide a delayed clock pulse to the clock select register.

7. An ASIC clock circuit, comprising:
   a number of synchronizing phase select circuits each coupled to one of a number of ASIC modules;
   a number of phase measure circuits (PMCs), wherein each PMC is coupled to one of the number of ASIC modules to receive a current ASIC module clock signal, wherein each PMC also receives a clock signal from a clock generator,
   a compute normalized delays block operable to receive signals from each of the number of PMCs, wherein the compute normalized delays block is operable to compare measured phase delay values from each PMC and normalize out a common delay; and
   a number of synchronizing phase adjust state machine circuits operable to receive signals from the compute normalized delays block, each synchronizing phase adjust state machine circuit operable to specify a target phase tap and a clock select tap to one of the synchronizing phase select circuits.

8. The circuit of claim 7, wherein the clock generator is coupled to each of the number of synchronizing phase select circuits to provide incrementally delayed clocks.

9. The circuit of claim 7, wherein each synchronizing phase adjust state machine circuit includes a phase adjust range check circuit operable to separate a phase adjustment into different sized phase adjust steps.

10. The circuit of claim 9, wherein the different sized phase adjust steps include at least three different sized phase adjust steps.

11. The circuit of claim 7, wherein the target phase tap is provided to a clock select register and wherein the clock select tap is used to provide a delayed clock pulse.

12. An integrated circuit (IC), comprising:
a clock generator;
a number of synchronizing phase select circuits coupled to the clock generator, wherein each synchronizing phase select circuit is coupled to a respective ASIC module, and wherein each synchronizing phase select circuit is operable to provide an adjusted delay to the respective ASIC module;
means for separating a phase offset into different phase adjust step sizes in providing the adjusted delay to the respective ASIC module; and
means for specifying a target phase tap and a clock select tap to transition to a target phase, wherein the target phase tap is provided to a clock select register and wherein the clock select tap is used to provide a delayed clock pulse to the clock select register in providing the adjusted delay to the respective ASIC module.

13. The IC of claim 12, wherein the IC further includes means for normalizing out a common delay from each of a number of ASIC modules.

14. The IC of claim 13, wherein the means for normalizing out a common delay from each of the number of ASIC modules includes;
a number of phase measure circuits (PMCs), wherein each PMC is coupled to one of the number of ASIC modules to receive a current ASIC module clock signal, and wherein each PMC also receives a clock signal from the clock generator in order to calculate measured phase delay values; and
a compute normalized delays block operable to receive signals from each of the number of PMCs, and wherein the compute normalized delays block includes a number of logic circuits operable to;
subtract the measured phase delay values from a feedback input signal, representing a current clock phase delay value held in a clock select register associated with a particular ASIC module, in order to produce a correction value for each ASIC module;
determine a lowest common delay from among the measured phase delay values; and
subtract the lowest common delay from each of the correction values to output new normalized correction values for each ASIC module to transition to a target phase.

15. The IC of claim 14, wherein the means for separating a phase offset into different phase adjust step sizes includes;
a number of synchronizing phase adjust state machine circuits, each coupled to one of the number of ASIC modules, wherein each of the number of synchronizing phase adjust state machine circuits is coupled to the compute normalized delays block and to one of the synchronizing phase select circuits;
wherein each of the number of synchronizing phase adjust state machine circuits is operable to receive the new normalized correction value and the feedback input signal for the particular ASIC module; and
wherein each synchronizing phase adjust state machine circuit includes a logic circuit to subtract the new normalized correction value from the feedback input signal.

16. The IC of claim 15, wherein each synchronizing phase adjust state machine circuit includes a phase adjust range check circuit coupled to the logic circuit.

17. The IC of claim 16, wherein the means for specifying a target phase tap and a clock select tap includes a table driven state machine coupled to the phase adjust range check circuit.

18. The IC of claim 16, wherein each synchronizing phase adjust state machine circuit includes a firmware programmable phase adjust step size register coupled to the phase adjust range check circuit.

19. A method for adjusting clock delay, comprising:
receiving feedback clocks from independent ASIC modules;
comparing the feedback clocks to a reference clock to generate phase measurement values;
removing a common delay from the phase measurement values to produce normalized correction values;
selecting target phase values and clock select values using the normalized correction values; and
adjusting clock signals to independent ASIC modules based on the target phase values and clock select values.

20. The method of claim 19, wherein adjusting clock signals to independent ASIC modules based on the target phase values and clock select values includes:
providing a selected clock select value as an input to a delay clock pulse generator;
providing delayed clock signals from a system clock generator as input to the delay clock pulse generator; and
outputting a single pulse signal based on the selected clock select value.

21. The method of claim 20, wherein the method further includes using a clock select combiner logic circuit to provide the single pulse signal output by the clock pulse generator as one pulse in equally spaced intervals to a clock select register.

22. The method of claim 19, wherein adjusting clock signals to independent ASIC modules based on the target phase values and clock select values includes:
providing a selected target phase value to a clock select register; and
providing the selected target phase value from the clock select register to a clock multiplexer based on a selected clock select phase value.

23. The method of claim 19, wherein adjusting clock signals to independent ASIC modules based on the target phase values and clock select values includes:
providing incrementally delayed clocks as input to a clock multiplexer;
inputting a target phase value from a clock select register to the clock multiplexer based on a selected clock phase value; and
selecting a delayed clock based on the input target phase value.

24. The method of claim 19, wherein removing a common delay from the phase measurement values to form normalized correction values includes:
receiving measured phase delay values from the independent ASIC modules as generated from a respective phase measure circuit;
subtracting the measured phase delay values from a feedback signal provided by a clock select register in order to produce a correction value for each ASIC module;

determining a lowest common delay from among the measured phase delay values; and subtracting the lowest common delay from each of the correction values to output new normalized correction values for each ASIC module to transition to a target phase.

25. The method of claim 19, wherein selecting target phase values and clock select values using the normalized correction values includes:

receiving a new normalized correction value and a feedback signal provided by a clock select register for a particular ASIC module at a logic circuit within a synchronizing phase adjust state machine block;

using the logic circuit to subtract the new normalized correction value from the feedback input signal and output a binary number representing a target phase value to a phase adjust range check logic circuit; and receiving phase adjust step ranges at the phase adjust range check logic circuit from phase adjust step size registers;

comparing the target phase value to the received phase adjust step ranges to select a phase adjust step size;

comparing a selected phase adjust step size to a table listing associated target phase values and clock select values for various phase adjust step sizes and outputting a binary value to a phase adjust state machine; and outputting a target phase value and a clock select value from the phase adjust state machine based on the binary value, the new normalized correction value, and the feedback signal.

26. A method for clock adjustment, comprising:

providing a feedback clock signal from a number of modules;

for each module, measuring a phase of the signal relative to a reference clock to provide measured phase delay values;

normalizing out a common delay from the measured phase delay values to produce normalized phase delay values; and for each module, using a table driven state machine to specify both a target phase tap and a clock select tap based on the normalized measured phase delay values.

27. The method of claim 26, wherein the method further includes using the clock select tap to provide a delayed clock pulse.

28. The method of claim 26, wherein the method further includes adjusting a clock delay to each module based on the target phase tap and the delayed clock pulse.

29. The method of claim 26, wherein the method further includes separating a phase travel into one of at least three different sized phase adjust steps using a phase adjust register.

30. A computer readable medium having a set of computer executable instructions operable to cause a device to perform a method, the method comprising:

measuring a phase delay of a clock signal received at an ASIC module;

separating a phase adjustment for the ASIC module into different sized phase adjust steps using a phase adjust register; and using a table driven state machine to specify both a target phase tap and a clock select tap for the ASIC module.

31. The medium of claim 30, wherein the method further includes;

providing the target phase tap to a clock select register; and clocking the clock select register by using the clock select tap to produce a delayed clock pulse.

32. The medium of claim 31, wherein the method further includes adjusting the clock signal to the ASIC module based on the target phase tap and delayed clock pulse.

* * * * *